United States Patent
Tseng et al.

(10) Patent No.: US 8,294,034 B2
(45) Date of Patent: Oct. 23, 2012

(54) CIRCUIT BOARD AND PROCESS FOR FABRICATING THE SAME

(75) Inventors: Tzyy-Jang Tseng, Hsinchu (TW);
Shu-Sheng Chiang, Taipei (TW);
Tsung-Yuan Chen, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 375 days.

(21) Appl. No.: 12/789,895

(22) Filed: May 28, 2010

(65) Prior Publication Data
US 2011/0147056 A1 Jun. 23, 2011

(30) Foreign Application Priority Data

Dec. 17, 2009 (TW) .............................. 98143395 A

(51) Int. Cl.
*H05K 1/00* (2006.01)
*H05K 1/11* (2006.01)

(52) U.S. Cl. ........ 174/256; 174/262; 174/266; 361/748; 361/762; 430/5; 430/270.1; 430/311; 430/314; 29/830; 29/846; 29/847; 216/18; 216/51; 216/56; 216/65; 257/700; 257/758; 257/774; 438/622; 438/638; 438/637; 438/640; 438/667; 427/96.1; 427/96.2; 427/555; 427/556

(58) Field of Classification Search .......... 174/252–267; 361/748–755, 790–795, 803; 430/270.1, 430/311, 5, 314, 319, 330; 29/825–852, 29/890.1, 611; 427/96.1, 96.2, 97, 97.4, 427/97.5, 53.1, 99.1, 554–556, 596, 96.9, 427/97.7, 103; 438/622, 637–640, 667, 668, 438/106–126; 257/700, 750, 758, 774, E21.495, 257/E23.01, E23.067, 686, 698; 228/225, 228/245, 262.1; 216/27, 17, 20, 18, 51, 56, 216/57, 65
See application file for complete search history.

(56) References Cited

U.S. PATENT DOCUMENTS 2,008 A * 3/1841 Cornelius .................... 285/11
(Continued)

FOREIGN PATENT DOCUMENTS

JP 11274727 A * 10/1999
(Continued)

OTHER PUBLICATIONS

"Office Action of Taiwan Counterpart Application", issued on Apr. 25, 2012, p. 1-p. 6, in which the other listed reference was cited.

*Primary Examiner* — Michail V Datskovskiy
(74) *Attorney, Agent, or Firm* — J.C. Patents

(57) ABSTRACT

A circuit board including a circuit substrate, a first dielectric layer, an antagonistic activation layer, a first conductive layer, a second conductive layer and a second dielectric layer is provided. The circuit substrate has a first surface and a first circuit layer. The first dielectric layer is disposed on the circuit substrate and covers the first surface and the first circuit layer. The first dielectric layer has a second surface, at least a blind via extending from the second surface to the first circuit layer and an intaglio pattern. The antagonistic activation layer is disposed on the second surface of the dielectric layer. The first conductive layer is disposed in the blind via. The second conductive layer is disposed in the intaglio pattern and the blind via and covers the first conductive layer. The second conductive layer is electrically connected with the first circuit layer via the first conductive layer.

20 Claims, 4 Drawing Sheets

U.S. PATENT DOCUMENTS

| | | | | |
|---|---|---|---|---|
| 4,566,186 | A * | 1/1986 | Bauer et al. | 29/852 |
| 4,894,115 | A * | 1/1990 | Eichelberger et al. | 134/1.1 |
| 5,108,785 | A * | 4/1992 | Lincoln et al. | 427/555 |
| 5,196,376 | A * | 3/1993 | Reche | 216/18 |
| 6,211,485 | B1 * | 4/2001 | Burgess | 219/121.7 |
| 6,240,636 | B1 * | 6/2001 | Asai et al. | 29/852 |
| 6,631,558 | B2 * | 10/2003 | Burgess | 29/852 |
| 6,657,159 | B2 * | 12/2003 | McKee et al. | 219/121.71 |
| 6,930,257 | B1 * | 8/2005 | Hiner et al. | 174/262 |
| 6,967,124 | B1 | 11/2005 | Huemoeller et al. | |
| 7,552,531 | B2 * | 6/2009 | Takada et al. | 29/852 |
| 7,698,813 | B2 * | 4/2010 | Wang | 29/852 |
| 7,745,933 | B2 * | 6/2010 | Yu | 257/750 |
| 7,774,932 | B2 * | 8/2010 | Chen et al. | 29/852 |
| 8,075,788 | B2 * | 12/2011 | Arai et al. | 216/13 |
| 8,166,652 | B2 * | 5/2012 | Yu | 29/852 |
| 2002/0083586 | A1 * | 7/2002 | Iijima et al. | 29/847 |
| 2007/0114203 | A1 * | 5/2007 | Kang | 216/13 |
| 2007/0158852 | A1 * | 7/2007 | Hsu | 257/774 |
| 2008/0261158 | A1 * | 10/2008 | Jo et al. | 430/314 |

FOREIGN PATENT DOCUMENTS

| | | |
|---|---|---|
| TW | 200805611 | 1/2008 |
| TW | 200952131 | 12/2009 |

\* cited by examiner

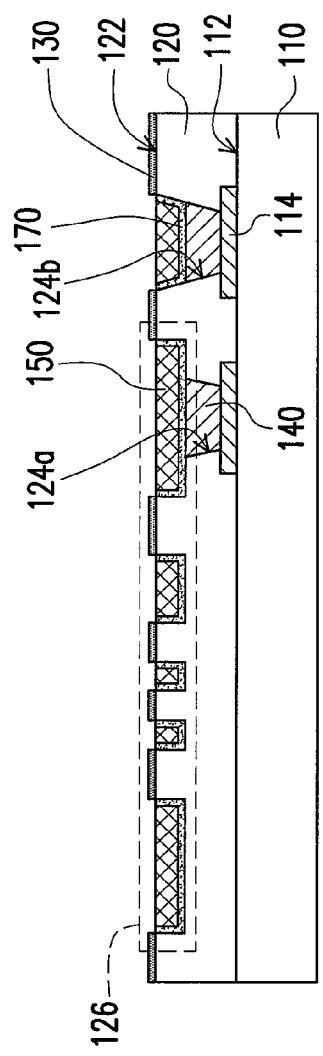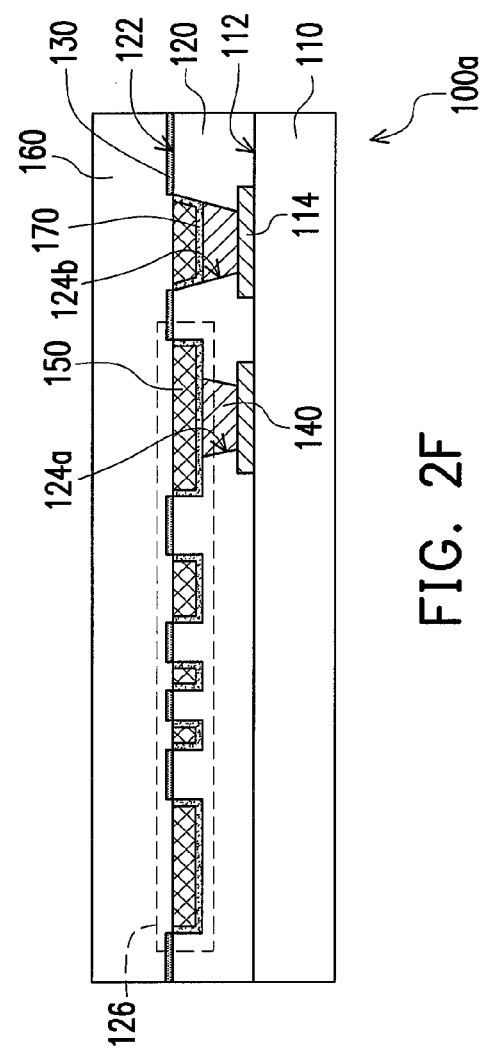

CIRCUIT BOARD AND PROCESS FOR FABRICATING THE SAME

CROSS-REFERENCE TO RELATED APPLICATION

This application claims the priority benefit of Taiwan application serial no. 98143395, filed on Dec. 17, 2009. The entirety of the above-mentioned patent application is hereby incorporated by reference herein and made a part of this specification.

BACKGROUND OF THE INVENTION

1. Field of the Invention

The present invention relates to a circuit board and a method for manufacturing the circuit board, and in particular, to a circuit board with a relatively better reliability and a method for manufacturing the circuit board.

2. Description of Related Art

According to the current technologies, an embedded circuit board has been evolved from a common non-embedded circuit board. In particular, the common non-embedded circuit board is characterized in that circuits therein protrude from a surface of a dielectric layer. By contrast, circuits of the embedded circuit board are buried in the dielectric layer. Currently, a circuit structure of the circuit board is formed by performing a photolithography and etching process or a laser ablating process.

The fabricating process for forming build-up wiring structure of the embedded circuit board fabricated with the use of the laser ablating process comprises the following steps. A dielectric layer is formed on a circuit board having a circuit layer. Then, the surface of the dielectric layer is illuminated by a laser beam to form an intaglio pattern and a blind via connecting to the circuit layer. Thereafter, an electroplating process is performed to form a conductive layer filling up the blind via and the intaglio pattern. Herein, the build-up wiring structure of the embedded circuit board is roughly formed so far.

Since the depth of the blind via is different from the depth of the intaglio, the electroplating condition is not easy to be controlled when the electroplating process is performed, which leads to poor uniformity of the thickness of the conductive layer. Therefore, when a process for removing a portion of the conductive layer at the outside of the intaglio and the blind via is later performed, it is hard to control the thickness of the removed portion of the conductive layer. Hence, it is easy to improperly thinning the conductive layer of the embedded circuit board or leaving the conductive residue on the dielectric layer. Moreover, when the build-up wiring structure is fabricated on the aforementioned dielectric layer, the quality of the electroplating process is poor and the yield of the electroplating process is low. Therefore, the fabrication yield of the build-up wiring structure is decreased and the reliability of the circuit board is decreased as well.

SUMMARY OF THE INVENTION

The present invention provides a circuit board and a process for manufacturing the circuit board capable of improving the reliability of the circuit board.

The present invention provides a circuit board having a circuit substrate, a first dielectric layer, an antagonistic activation layer, a first conductive layer and a second conductive layer. The circuit substrate has a first surface and a first circuit layer. The first dielectric layer is disposed on the circuit substrate and covers the first surface and the first circuit layer. The first dielectric layer has a second surface, at least a blind via extending from the second surface to the first circuit layer and an intaglio pattern. The antagonistic activation layer is disposed on the second surface of the first dielectric layer. The first conductive layer is disposed in the blind via. The second conductive layer is disposed in the intaglio pattern and the blind via and covers the first conductive layer. The second conductive layer is electrically connected to the first circuit layer through the first conductive layer.

In one embodiment of the invention, a height of the blind via is denoted as H and a thickness of the first conductive layer is denoted as h, and a relationship between h and H complies with $0.2 \leq (h/H) \leq 0.9$.

In one embodiment of the present invention, the intaglio pattern is connected to the blind via.

In one embodiment of the present invention, the circuit board further comprises an activation layer disposed between the intaglio pattern of the first dielectric layer and the second conductive layer and disposed between the first conductive layer and the second conductive layer.

In one embodiment of the present invention, a material of the antagonistic activation layer includes a polymer material without having hydroxyl group or carboxyl group.

In one embodiment of the present invention, the polymer material is selected from a group comprising of epoxy, polyimide, liquid crystal polymer, methacrylate resin, vinyl phenyl resin, allyl resin, polyacrylate resin, polyether resin, polyolefin resin, polyamine resin, polysiloxane resin and the combination thereof.

In one embodiment of the present invention, a thickness of the antagonistic activation layer is about 1 nm~15 micrometers.

In one embodiment of the present invention, the first circuit layer is embedded in the circuit substrate, and a surface of the first circuit layer and the first surface are substantially aligned.

In one embodiment of the present invention, the first circuit layer is disposed on the first surface of the circuit substrate.

In one embodiment of the present invention, the circuit board further comprises a second dielectric layer disposed on the first dielectric layer and covering the antagonistic activation layer and the second conductive layer.

In one embodiment of the present invention, the materials of the first dielectric layer and the second dielectric layer are the same.

In one embodiment of the present invention, the materials of the first dielectric layer and the second dielectric layer are different from each other.

The present invention further provides a process for fabricating a circuit board. A circuit substrate is provided. The circuit substrate has a first surface and a first circuit layer. A first dielectric layer is formed on the circuit substrate. The first dielectric layer has a second surface and covers the first surface and the first circuit layer. An antagonistic activation layer is formed on the second surface of the first dielectric layer. The antagonistic activation layer is illuminated by a laser beam to form at least a blind via extending from the antagonistic activation layer to the first circuit layer and an intaglio pattern. A first conductive layer is formed in the blind via. A second conductive layer is formed in the intaglio pattern and the blind via. The second conductive layer covers the first conductive layer, and the second conductive layer is electrically connected to the first circuit layer through the first conductive layer.

In one embodiment of the present invention, the step for forming the antagonistic activation layer comprises adhering a resin film having a capability of image transferring.

In one embodiment of the present invention, a thickness of the antagonistic activation layer is about 1 nm~15 micrometers.

In one embodiment of the present invention, a material of the antagonistic activation layer includes a polymer material without having hydroxyl group or carboxyl group.

In one embodiment of the present invention, the polymer material is selected from a group comprising of epoxy, polyimide, liquid crystal polymer, methacrylate resin, vinyl phenyl resin, allyl resin, polyacrylate resin, polyether resin, polyolefin resin, polyamine resin, polysiloxane resin and the combination thereof.

In one embodiment of the present invention, the step of forming the antagonistic activation layer includes spray coating a nano-scale antagonistic activation material.

In one embodiment of the present invention, a thickness of the antagonistic activation layer is about 1 nm~15 micrometers.

In one embodiment of the present invention, the laser beam includes an infrared laser source or an ultraviolet laser source.

In one embodiment of the present invention, the step for forming the first conductive layer in the blind via comprises a chemical deposition.

In one embodiment of the invention, a height of the blind via is denoted as H and a thickness of the first conductive layer is denoted as h, and a relationship between h and H complies with $0.2 \leq (h/H) \leq 0.9$.

In one embodiment of the present invention, before the second conductive layer is formed, the process for fabricating the circuit board further comprises forming an activation layer in the intaglio pattern of the first dielectric layer and on the first conductive layer.

In one embodiment of the present invention, the step for forming the second conductive layer in the intaglio pattern and the blind via comprises a chemical deposition.

In one embodiment of the present invention, the first circuit layer is embedded in the circuit substrate, and a surface of the first circuit layer and the first surface are substantially aligned.

In one embodiment of the present invention, the first circuit layer is disposed on the first surface of the circuit substrate.

In one embodiment of the present invention, the intaglio pattern is connected to the blind via.

In one embodiment of the present invention, before the second conductive layer is formed in the intaglio pattern and the blind via, the process for fabricating the circuit board further comprises forming a second dielectric layer on the first dielectric layer and the second dielectric layer covers the antagonistic activation layer and the second conductive layer.

In one embodiment of the present invention, the materials of the first dielectric layer and the second dielectric layer are the same.

In one embodiment of the present invention, the materials of the first dielectric layer and the second dielectric layer are different from each other.

Accordingly, in the process for fabricating the circuit board of the present invention, the first conductive layer is formed in the blind via in advance to decrease the step height between the blind via and the intaglio pattern, and then the second conductive layer is formed on the first conductive layer in the blind via and in the intaglio pattern. Hence, the thickness uniformity and the surface smoothness of the conductive layer formed in the blind via and the intaglio pattern can be well improved. Moreover, the antagonistic activation layer not only can be used to limit the deposition location of the second conductive layer to prevent the second conductive layer from the problem of over-deposition but also can be used as the interface layer between the first dielectric layer and the second dielectric layer.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A through 2E are schematic cross-sectional views illustrating a process for fabricating a circuit board according to one embodiment of the present invention.

FIG. 2F is a schematic cross-sectional view of a circuit board according to another embodiment of the present invention.

DESCRIPTION OF EMBODIMENTS

Figure 1:
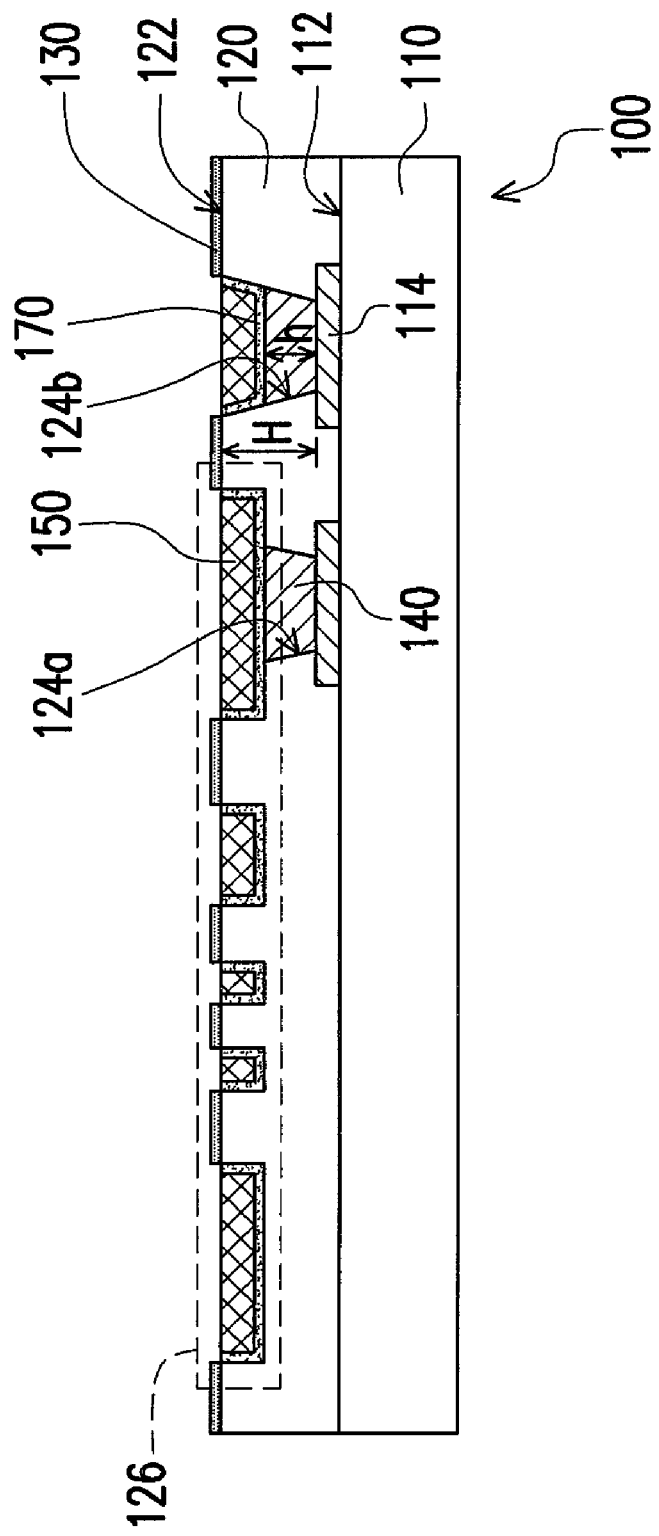
FIG. 1 is a schematic cross-sectional view of a circuit board according to one embodiment of the present invention.

FIG. 1 is a schematic cross-sectional view of a circuit board according to one embodiment of the present invention. As shown in FIG. 1, in the present embodiment, a circuit board 100 comprises a circuit substrate 110, a first dielectric layer 120, an antagonistic activation layer 130, a first conductive layer 140 and a second conductive layer 150. It should be noticed that the structure of the circuit board 100 can have a single-layered circuit layer or a multi-layered circuit layer. That is, the circuit board 100 can be a single-layered circuit board, a double-layered circuit board or a multi-layered circuit board. In the present embodiment, the circuit board 100 depicted in FIG. 1 as a build-up wiring board is used to describe the invention.

More specifically, the circuit substrate 110 has a first surface 112 and a first circuit layer 114. The first circuit layer 114 is disposed on the first surface 112 of the circuit substrate 110. That is, the first circuit layer 114 can be a kind of normal circuit layer (which is not the embedded circuit layer). It should be mentioned that although the first circuit layer 114 is disposed on the first surface 112 of the circuit substrate 110 in the embodiment shown in FIG. 1, the first circuit layer 114 can be embedded in the circuit substrate 110 and the surface of the first circuit layer 114 is substantially aligned with the first surface 112 in the other embodiment not shown by drawings. That is, the first circuit layer 114 is basically a kind of embedded circuit layer. In other words, the structure of the circuit substrate 110 depicted in FIG. 1 merely serves as an example of the present invention but not a limitation to the present invention.

The first dielectric layer 120 is disposed on the circuit substrate 110 and covers the first surface 112 and the first circuit layer 114. In the present embodiment, the first dielectric layer 120 has a second surface 122, at least a blind via 124 (FIG. 1 schematically shows two blind vias 124a and 124b) extending from the second surface 122 to the first circuit layer 114 and an intaglio pattern 126. Further, the blind via 124a is connected to the intaglio pattern 126.

The antagonistic activation layer 130 is disposed on the second surface 122 of the first dielectric layer 120. More particularly, in the present embodiment, the antagonistic activation layer 130 is used to limit the deposition location of the second conductive layer 150. That is, the second conductive layer 150 is only deposited in the blind vias 124a and 124b and in the intaglio pattern 126 without being covered by the antagonistic activation layer 130. The material of the antagonistic activation layer 130 can be, for example, a polymer material without having hydroxyl group or carboxyl group. Further, the polymer material can be, for example, selected from a group comprising of epoxy, polyimide, liquid crystal polymer, methacrylate resin, vinyl phenyl resin, allyl resin, polyacrylate resin, polyether resin, polyolefin resin, polyamine resin, polysiloxane resin and the combination thereof In addition, the thickness of the antagonistic activation layer 130 is, for example, 1 nm~15 micrometers.

The first conductive layer 140 is disposed in the blind vias 124a and 124b. The height of blind via 124b (or the blind via 124a) is denoted as H and the thickness of the first conductive layer 140 is denoted as h. Preferably, the relationship between H and h complies with $0.2 \leq (h/H) \leq 0.9$. The second conductive layer 150 is disposed in the intaglio pattern 126 and the blind vias 124a and 124b and covers the first conductive layer 140. That is, the second conductive layer 150 is disposed in the intaglio pattern 126 and is disposed in the blind vias 124a and 124b in which the first conductive layer 140 has been disposed. Furthermore, in the present embodiment, the second conductive layer 150 can be electrically connected to the first circuit layer 114 of the circuit substrate 110 through the first conductive layer 140.

It should be mentioned that, since the circuit board 100 has the antagonistic activation layer 130, the deposition location of the second conductive layer 150 is limited while the second conductive layer 150 is disposed in the intaglio pattern 126 and on the first conductive layer 140. Thus, the problem of over-deposition of the second conductive layer 150 can be avoided. In other words, the second conductive layer 150 does not cover the antagonistic activation layer 130.

In addition, the circuit board 100 of the present embodiment further comprises an activation layer 170 disposed between the intaglio pattern 126 of the first dielectric layer 120 and the second conductive layer 150 and disposed between the first conductive layer 140 and the second conductive layer 150. In the present embodiment, the activation layer 170 is used to generate the initiation of the chemical deposition reaction in order to benefit the formation of the second conductive layer 150 in the intaglio pattern 126 and on the first conductive layer 140. The material of the activation layer 170 can be, for example, palladium.

Since the blind vias 124a and 124b of the first dielectric layer 120 of the present embodiment has the first conductive layer 140 formed therein, the step height between the blind vias 124a and 124b and the intaglio pattern 126 can be decreased. When the ratio of h to H is getting large and it means the thickness of the first conductive layer 140 is relatively large, the thickness of the second conductive layer 150 disposed in the blind vias 124a and 124b is substantially equal to the thickness of the second conductive layer 150 to be disposed in the intaglio pattern 126. Hence, when the second conductive layer 150 is disposed in the blind vias 124a and 124b and in the intaglio pattern 126, the thickness uniformity and the surface smoothness of the second conductive layer 150 can be well improved. Further, the circuit board 100 also has the antagonistic activation layer 130 and the antagonistic activation layer 130 is used to limit the deposition location of the second conductive layer 150 so as to avoid the problem of over-deposition of the second conductive layer 150. In brief, by comparing with the conventional technique, the design of the circuit board 100 of the present embodiment can effectively avoid the poor result of the conventional via filling plating and the poor uniformity of the conductive layer and can improve the reliability of the circuit board.

Up to here, only the structure of the circuit board 100 of the present invention is described, while a process of fabricating the circuit board 100 of the present invention is not yet provided. Hence, the structure of the circuit board 100 shown in FIG. 1 is used as an example accompanying with FIGS. 2A through 2E to detail the process for fabricating the circuit board 100 in the following descriptions.

Figure 2A:
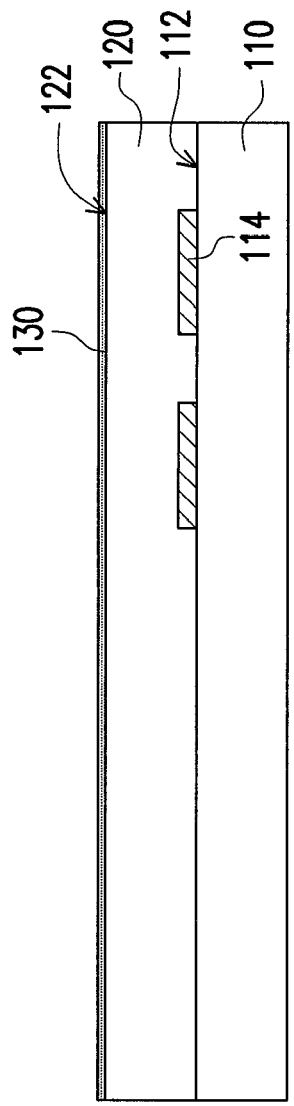

FIGS. 2A through 2E are schematic cross-sectional views illustrating a process for fabricating a circuit board according to one embodiment of the present invention. As shown in FIG. 2A, according to the process for fabricating the circuit board 100 of the present embodiment, a circuit substrate 110 is provided. The circuit substrate 110 has a first surface 112 and a first circuit layer 114. The first circuit layer 114 is disposed on the first surface 112 of the circuit substrate 110. That is, the first circuit layer 114 is basically a kind of normal circuit layer (which is not an embedded circuit layer). It should be mentioned that, in the other embodiment not shown by drawings, the first circuit layer 114 can be also embedded in the circuit substrate 110, and the surface of the first circuit layer 114 and the first surface 112 are substantially aligned. That is, the first circuit layer 114 is basically a kind of embedded circuit layer. Thus, the structure of the circuit substrate 110 depicted in FIG. 2 merely serves as an example of the present invention but not a limitation to the present invention.

As shown in FIG. 2A, a first dielectric layer 120 is formed on the circuit substrate 110. The first dielectric layer 120 has a second surface 122 and covers the first surface 112 and the first circuit layer 114.

Still referring to FIG. 2A, an antagonistic activation layer 130 is formed on the second surface 122 of the first dielectric layer 120. The antagonistic activation layer 130 is used to limit the formation location of the later formed conductive layer. That is, the later formed conductive layer can be only be deposited on the location without having any antagonistic activation layer 130 formed thereon. In the present embodiment, the method for forming the antagonistic activation layer 130 comprises adhering a resin film having a capability of image transferring or spray coating a nano-scale antagonistic activation material. That is, after the antagonistic activation layer 130 is formed, the antagonistic activation layer 130 is adhered on the second surface 122 of the first dielectric layer 120. Alternatively, by the spray coating process, the antagonistic activation layer 130 is formed on the first dielectric layer 120. In addition, the thickness of the antagonistic activation layer 130 is, for example, 1 nm~15 micrometers. The material of the antagonistic activation layer 130 can be, for example, a polymer material without having hydroxyl group or carboxyl group. Further, the polymer material can be, for example, selected from a group comprising of epoxy, polyimide, liquid crystal polymer, methacrylate resin, vinyl phenyl resin, allyl resin, polyacrylate resin, polyether resin, polyolefin resin, polyamine resin, polysiloxane resin and the combination thereof.

Figure 2B:
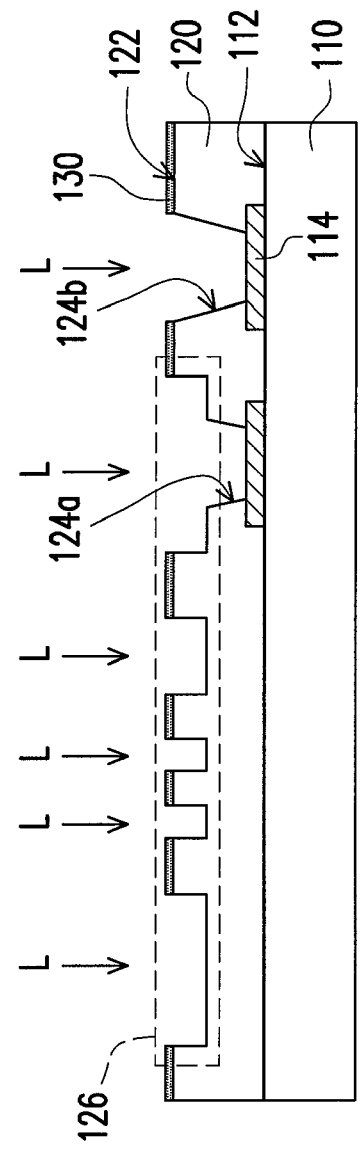

As shown in FIG. 2B, the antagonistic activation layer 130 is illuminated by a laser beam L to form at least a blind via 124 (FIG. 2B schematically shows two blind vias 124a and 124b) extending from the antagonistic activation layer 130 to the first circuit layer 114 and an intaglio pattern 126. Further, the blind via 124a is connected to the intaglio pattern 126. In the present embodiment, the laser beam L can be, for example, an infrared laser source or an ultraviolet laser source.

Figure 2C:
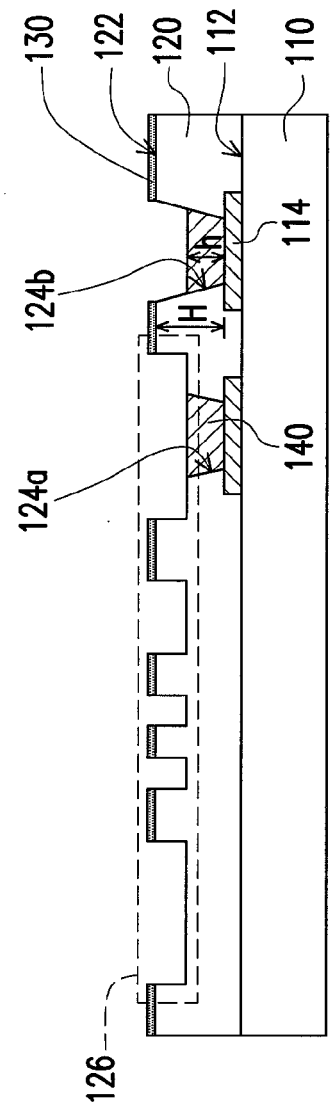

As shown in FIG. 2C, a first conductive layer 140 is formed in the blind vias 124a and 124b. The method for forming the first conductive layer 140 in the blind vias 124a and 124b can be, for example, a chemical deposition. Particularly, in the present embodiment, the height of the blind via 124b (or the blind via 124a) is denoted as H and the thickness of the first conductive layer 140 is denoted as h, and the relationship between h and H complies with $0.2 \leqq (h/H) \leqq 0.9$.

Figure 2D:
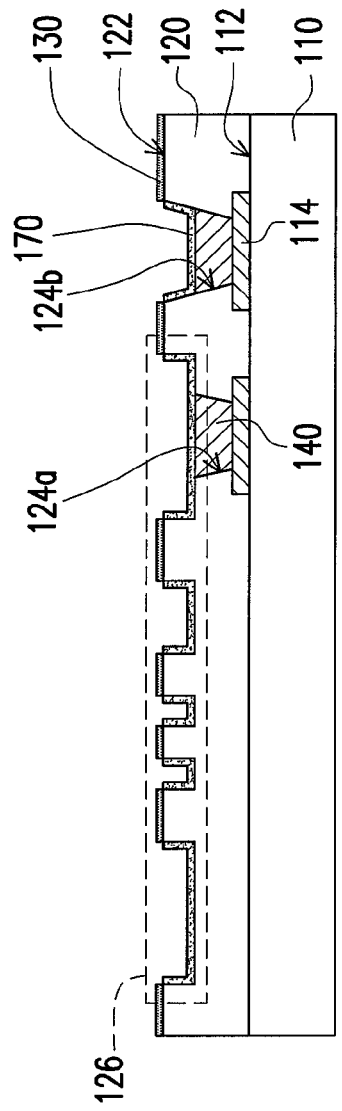

As shown in FIG. 2D, an activation layer 170 is formed in the intaglio pattern 126 of the first dielectric layer 120 and on the first conductive layer 140 for generating an initiation of the chemical deposition reaction which benefits the formation of the second conductive layer 150 in the intaglio pattern 126 and on the first conductive layer 140 in the later process step. In the present embodiment, the material of the activation layer 170 can be, for example, palladium.

As shown in FIG. 2E, a second conductive layer 150 is formed in the intaglio pattern 126 and the blind vias 124a and 124b. The second conductive layer 150 covers the first conductive layer 140, and the second conductive layer 150 is electrically connected to the first circuit layer 114 through the first conductive layer 140. In the present embodiment, the surface of the second conductive layer 150 is substantially aligned with the second surface 122 of the first dielectric layer 120. That is, the second conductive layer 150 does not cover the antagonistic activation layer 130. Moreover, the method for forming the first conductive layer 140 in the intaglio pattern 126 and in the blind vias 124a and 124b can be, for example, a chemical deposition. Herein, the fabrication of the circuit board 100 is substantially completed.

It should be noticed that, since the antagonistic activation layer 130 is formed on the second surface 122 of the first dielectric layer 120, a second dielectric layer 160 can be also formed on the first dielectric layer 120 in other embodiment of the process for fabricating the circuit board. Further, the second dielectric layer 160 covers the antagonistic activation layer 130 and the second conductive layer 150, as shown in FIG. 2F. That is, the antagonistic activation layer 130 of the circuit board 100 is located between the first dielectric layer 120 and the second dielectric layer 160 and is used as an interface layer between the first dielectric layer 120 and the second dielectric layer 160. Furthermore, in the present embodiment, the material of the second dielectric layer 160 and the material of the first dielectric layer 120 can be selected to be substantially equal to or different from each other according to different requirements for specific uses and are not limited herein.

In the process for fabricating the circuit board 100 of the present invention, the first conductive layer 140 is formed in the blind vias 124a and 124b in advance to decrease the step height between the blind vias 124a and 124b and the intaglio pattern 126, and then the second conductive layer 150 is formed on the first conductive layer 140 in the blind vias 124a and 124b and in the intaglio pattern 126. Hence, the thickness uniformity and the surface smoothness of the conductive layer formed in the blind vias 124a and 124b and the intaglio pattern 126 can be well improved. Moreover, the antagonistic activation layer 130 formed in the present embodiment not only can be used to limit the deposition location of the second conductive layer 150 to prevent the problem of over-deposition of the second conductive layer 150 but also can be used as the interface layer between the first dielectric layer 120 and the second dielectric layer 160.

Accordingly, in the present invention, the first conductive layer is formed in the blind via in advance to decrease the step height between the blind via and the intaglio pattern, and then the second conductive layer is formed on the first conductive layer in the blind via and in the intaglio pattern. Hence, the thickness uniformity and the surface smoothness of the conductive layer formed in the blind via and the intaglio pattern can be well improved. Moreover, the antagonistic activation layer not only can be used to limit the deposition location of the second conductive layer to prevent the second conductive layer from the problem of over-deposition but also can be used as the interface layer between the first dielectric layer and the second dielectric layer. By comparing with the conventional technique, the circuit board and the process for fabricating the circuit board of the present embodiment can effectively avoid the poor result of the conventional via filling plating and the poor uniformity of the conductive layer and can improve the reliability of the circuit board.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A circuit board, comprising:
   a circuit substrate having a first surface and a first circuit layer;
   a first dielectric layer disposed on the circuit substrate and covering the first surface and the first circuit layer, wherein the first dielectric layer has a second surface, at least a blind via extending from the second surface to the first circuit layer and an intaglio pattern;
   an antagonistic activation layer disposed on the second surface of the first dielectric layer;
   a first conductive layer disposed in the blind via; and
   a second conductive layer disposed in the intaglio pattern and the blind via and covering the first conductive layer, wherein the second conductive layer is electrically connected to the first circuit layer through the first conductive layer.

2. The circuit board of claim 1, wherein a height of the blind via is denoted as H and a thickness of the first conductive layer is denoted as h, and a relationship between h and H complies with $0.2 \leqq (h/H) \leqq 0.9$.

3. The circuit board of claim 1, wherein the intaglio pattern is connected to the blind via.

4. The circuit board of claim 1, further comprising an activation layer disposed between the intaglio pattern of the first dielectric layer and the second conductive layer and disposed between the first conductive layer and the second conductive layer.

5. The circuit board of claim 1, wherein a material of the antagonistic activation layer includes a polymer material without having hydroxyl group or carboxyl group.

6. The circuit board of claim 1, wherein a thickness of the antagonistic activation layer is about 1 nm~15 micrometers.

7. The circuit board of claim 1, wherein the first circuit layer is embedded in the circuit substrate, and a surface of the first circuit layer and the first surface are substantially aligned.

8. The circuit board of claim 1, wherein the first circuit layer is disposed on the first surface of the circuit substrate.

9. The circuit board of claim 1, further comprising a second dielectric layer disposed on the first dielectric layer and covering the antagonistic activation layer and the second conductive layer.

10. The circuit board of claim 9, wherein materials of the first dielectric layer and the second dielectric layer are the same.

11. The circuit board of claim 9, wherein materials of the first dielectric layer and the second dielectric layer are different from each other.

12. A process for fabricating a circuit board, comprising:
providing a circuit substrate having a first surface and a first circuit layer;
forming a first dielectric layer on the circuit substrate, wherein the first dielectric layer has a second surface and covers the first surface and the first circuit layer;
forming an antagonistic activation layer on the second surface of the first dielectric layer;
illuminating the antagonistic activation layer with a laser beam to form at least a blind via extending from the antagonistic activation layer to the first circuit layer and an intaglio pattern;
forming a first conductive layer in the blind via; and
forming a second conductive layer in the intaglio pattern and the blind via, wherein the second conductive layer covers the first conductive layer, and the second conductive layer is electrically connected to the first circuit layer through the first conductive layer.

13. The process of claim 12, wherein a method of forming the antagonistic activation layer comprises adhering a resin film having a capability of image transferring.

14. The process of claim 12, wherein a material of the antagonistic activation layer includes a polymer material without having hydroxyl group or carboxyl group.

15. The process of claim 12, wherein a method of forming the antagonistic activation layer comprises spray coating a nano-scale antagonistic activation material.

16. The process of claim 12, wherein a method of forming the first conductive layer in the blind via comprises a chemical deposition.

17. The process of claim 12, wherein a height of the blind via is denoted as H and a thickness of the first conductive layer is denoted as h, and a relationship between h and H complies with $0.2 \leqq (h/H) \leqq 0.9$.

18. The process of claim 12, before the step of forming the second conductive layer, further comprising:
forming an activation layer in the intaglio pattern of the first dielectric layer and on the first conductive layer.

19. The process of claim 12, wherein a method of forming the second conductive layer in the intaglio pattern and the blind via comprises a chemical deposition.

20. The process of claim 12, after the step of forming the second conductive layer in the intaglio pattern and the blind via, further comprising forming a second dielectric layer on the first dielectric layer, wherein the second dielectric layer covers the antagonistic activation layer and the second conductive layer.

* * * * *